US012652018B2

(12) United States Patent  
Khlat

(10) Patent No.: US 12,652,018 B2  
(45) Date of Patent: Jun. 9, 2026

(54) ACOUSTIC LOAD-LINE TUNING IN A WIRELESS TRANSMISSION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 90 days.

(21) Appl. No.: 18/398,288

(22) Filed: Dec. 28, 2023

(65) Prior Publication Data

US 2024/0258992 A1     Aug. 1, 2024

Related U.S. Application Data

(60) Provisional application No. 63/482,646, filed on Feb. 1, 2023.

(51) Int. Cl.  
   *H03H 9/17*       (2006.01)  
   *H01Q 5/335*     (2015.01)  
   *H03H 9/02*       (2006.01)

(52) U.S. Cl.  
   CPC ............ *H03H 9/171* (2013.01); *H01Q 5/335* (2015.01); *H03H 9/02086* (2013.01)

(58) Field of Classification Search  
   CPC ........ H01Q 5/335; H03H 9/542; H03H 9/171; H03H 9/02086  
   See application file for complete search history.

(56) References Cited

U.S. PATENT DOCUMENTS

| | | | |
|---|---|---|---|
| 3,568,108 A | 3/1971 | Poirier et al. | |
| 4,924,195 A | 5/1990 | Gonda | |
| 6,242,843 B1 | 6/2001 | Pohjonen et al. | |
| 6,862,441 B2 | 3/2005 | Ella | |

(Continued)

FOREIGN PATENT DOCUMENTS

| | | | |
|---|---|---|---|
| CN | 107727125 A | 2/2018 | |
| JP | 3854212 B2 | 12/2006 | |

(Continued)

OTHER PUBLICATIONS

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

(Continued)

*Primary Examiner* — Quan Tra  
(74) *Attorney, Agent, or Firm* — Withrow & Terranova, P.L.L.C.

(57) ABSTRACT

Acoustic impedance tuning in a wireless transmission circuit (a.k.a. wireless device) is provided. In aspects discussed herein, the wireless transmission circuit includes an acoustic load-line tuning circuit that can be configured to adapt a load-line impedance presenting to a power amplifier circuit. In embodiments disclosed herein, the acoustic load-line tuning circuit can be dynamically controlled to provide impedance matching between a power amplifier circuit and other load-line circuits (e.g., filter circuits, antenna switch circuits, and/or antenna circuits). As a result, it is possible to reduce a signal reflection resulting from an impedance mismatch between the power amplifier circuit and the load-line circuits, thus helping to improve performance of the wireless transmission circuit.

18 Claims, 8 Drawing Sheets

(56)     References Cited

U.S. PATENT DOCUMENTS

| | | | |
|---|---|---|---|
| 7,034,638 | B2 | 4/2006 | Yamamoto et al. |
| 7,161,434 | B2 | 1/2007 | Rhodes |
| 7,367,095 | B2 | 5/2008 | Larson, III et al. |
| 7,454,178 | B2 | 11/2008 | Block et al. |
| 7,573,354 | B2 | 8/2009 | Nishihara et al. |
| 7,656,228 | B2 | 2/2010 | Fukuda et al. |
| 7,659,796 | B2 | 2/2010 | Funami et al. |
| 7,692,270 | B2 | 4/2010 | Subramanyam et al. |
| 7,804,374 | B1 | 9/2010 | Brown et al. |
| 8,269,577 | B2 | 9/2012 | Inoue et al. |
| 8,576,024 | B2 | 11/2013 | Erb et al. |
| 8,620,250 | B2 | 12/2013 | Erb |
| 9,041,484 | B2 | 5/2015 | Burgener et al. |
| 9,190,979 | B2 | 11/2015 | Granger-Jones et al. |
| 9,255,912 | B2 | 2/2016 | Johnston et al. |
| 9,281,800 | B2 | 3/2016 | Tsuzuki |
| 9,438,202 | B2 | 9/2016 | Reinhardt et al. |
| 9,705,473 | B2 | 7/2017 | David et al. |
| 9,819,327 | B2 | 11/2017 | Maruthamuthu et al. |
| 9,847,769 | B2 | 12/2017 | Khlat et al. |
| 10,009,010 | B2 | 6/2018 | Kando et al. |
| 10,243,537 | B2 | 3/2019 | Khlat |
| 10,447,322 | B2 | 10/2019 | Wloczysiak |
| 10,476,481 | B2 | 11/2019 | Chen et al. |
| 10,985,731 | B2 | 4/2021 | Khlat |
| 11,050,412 | B2 * | 6/2021 | Khlat ................... H03H 9/0095 |
| 11,095,268 | B2 | 8/2021 | Schmidhammer |
| 11,165,412 | B2 | 11/2021 | Khlat et al. |
| 11,165,413 | B2 | 11/2021 | Khlat et al. |
| 11,742,818 | B2 | 8/2023 | Khlat |
| 2002/0158717 | A1 | 10/2002 | Toncich |
| 2002/0163400 | A1 | 11/2002 | Toncich |
| 2003/0227338 | A1 | 12/2003 | Kawakubo et al. |
| 2004/0119561 | A1 | 6/2004 | Omote |
| 2006/0098723 | A1 | 5/2006 | Toncich et al. |
| 2007/0030096 | A1 | 2/2007 | Nishihara et al. |
| 2007/0107519 | A1 | 5/2007 | Liu et al. |
| 2007/0131032 | A1 | 6/2007 | Liu |
| 2007/0296513 | A1 * | 12/2007 | Ruile ..................... H03B 5/366 |
| | | | 331/116 R |
| 2008/0024243 | A1 | 1/2008 | Iwaki et al. |
| 2008/0065290 | A1 | 3/2008 | Breed et al. |
| 2008/0129416 | A1 | 6/2008 | Volatier et al. |
| 2009/0289526 | A1 | 11/2009 | Sinha et al. |
| 2009/0315643 | A1 | 12/2009 | Yamakawa et al. |
| 2010/0308933 | A1 | 12/2010 | See et al. |
| 2012/0212304 | A1 | 8/2012 | Zhang et al. |
| 2012/0313731 | A1 | 12/2012 | Burgener et al. |
| 2013/0109332 | A1 | 5/2013 | Aigner |
| 2014/0070905 | A1 | 3/2014 | Raieszadeh et al. |
| 2014/0203887 | A1 | 7/2014 | Murata et al. |
| 2015/0163044 | A1 | 6/2015 | Analui et al. |
| 2016/0191012 | A1 | 6/2016 | Khlat et al. |
| 2016/0191016 | A1 | 6/2016 | Khlat et al. |
| 2017/0040948 | A1 | 2/2017 | Levesque |
| 2017/0048859 | A1 * | 2/2017 | Hayakawa ............... H01Q 1/48 |
| 2017/0093370 | A1 | 3/2017 | Khlat et al. |
| 2017/0201233 | A1 | 7/2017 | Khlat |
| 2017/0214389 | A1 | 7/2017 | Tsutsumi |
| 2017/0230066 | A1 | 8/2017 | Little et al. |
| 2017/0244382 | A1 | 8/2017 | Lear |
| 2017/0264268 | A1 | 9/2017 | Schmidhammer |
| 2018/0076793 | A1 | 3/2018 | Khlat et al. |
| 2018/0123562 | A1 | 5/2018 | Bradley |
| 2018/0159562 | A1 | 6/2018 | Bauder |
| 2018/0234078 | A1 | 8/2018 | Wada et al. |
| 2019/0081613 | A1 | 3/2019 | Nosaka |
| 2019/0181907 | A1 | 6/2019 | Pfann et al. |
| 2019/0199324 | A1 | 6/2019 | Matsumoto et al. |
| 2019/0260355 | A1 | 8/2019 | Khlat |
| 2019/0393860 | A1 * | 12/2019 | Shih ....................... H03H 9/564 |
| 2020/0028491 | A1 * | 1/2020 | Kuroyanagi ........... H03H 9/725 |

| | | | |
|---|---|---|---|
| 2020/0028567 | A1 | 1/2020 | Ashworth |
| 2020/0076366 | A1 * | 3/2020 | Bahr ...................... H03B 5/326 |
| 2020/0099360 | A1 | 3/2020 | Khlat |
| 2020/0099362 | A1 * | 3/2020 | Khlat ................. H03H 9/02007 |
| 2020/0099363 | A1 | 3/2020 | Khlat |
| 2020/0099364 | A1 | 3/2020 | Khlat |
| 2020/0136589 | A1 | 4/2020 | Khlat |
| 2020/0162057 | A1 | 5/2020 | Nakamura |
| 2020/0274519 | A1 | 8/2020 | Gamble et al. |
| 2021/0067139 | A1 | 3/2021 | Komatsu et al. |
| 2021/0194459 | A1 * | 6/2021 | Alavi ................. H03H 9/02228 |
| 2021/0297097 | A1 | 9/2021 | Okuda |
| 2021/0399750 | A1 | 12/2021 | Varela Campelo |
| 2022/0385272 | A1 | 12/2022 | Sun et al. |
| 2023/0083961 | A1 | 3/2023 | Komatsu et al. |
| 2023/0093885 | A1 | 3/2023 | Ella et al. |
| 2023/0134889 | A1 | 5/2023 | Costa |
| 2023/0216485 | A1 | 7/2023 | Wu et al. |
| 2023/0223920 | A1 | 7/2023 | Koohi et al. |
| 2023/0223922 | A1 | 7/2023 | Koohi et al. |
| 2023/0223926 | A1 | 7/2023 | Koohi et al. |
| 2023/0299746 | A1 | 9/2023 | Levesque |
| 2023/0402992 | A1 | 12/2023 | Noguchi et al. |
| 2024/0014803 | A1 | 1/2024 | Khlat |
| 2024/0053193 | A1 | 2/2024 | Khlat |
| 2024/0097650 | A1 | 3/2024 | Khlat et al. |
| 2024/0213956 | A1 | 6/2024 | Khlat et al. |
| 2024/0333257 | A1 | 10/2024 | Khlat |
| 2024/0333259 | A1 | 10/2024 | Khlat |
| 2024/0364309 | A1 | 10/2024 | Khlat |
| 2024/0413809 | A1 | 12/2024 | Khlat |

FOREIGN PATENT DOCUMENTS

| | | |
|---|---|---|
| JP | 2009130831 A | 6/2009 |
| JP | 4326063 B2 | 9/2009 |
| JP | 2022548348 A | 11/2022 |
| RU | 166154 U1 | 11/2016 |

OTHER PUBLICATIONS

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

U.S. Appl. No. 18/524,882, filed Nov. 30, 2023.

U.S. Appl. No. 18/242,066, filed Sep. 5, 2023.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

* cited by examiner

EXISTING WIRELESS
TRANSMISSION CIRCUIT
10

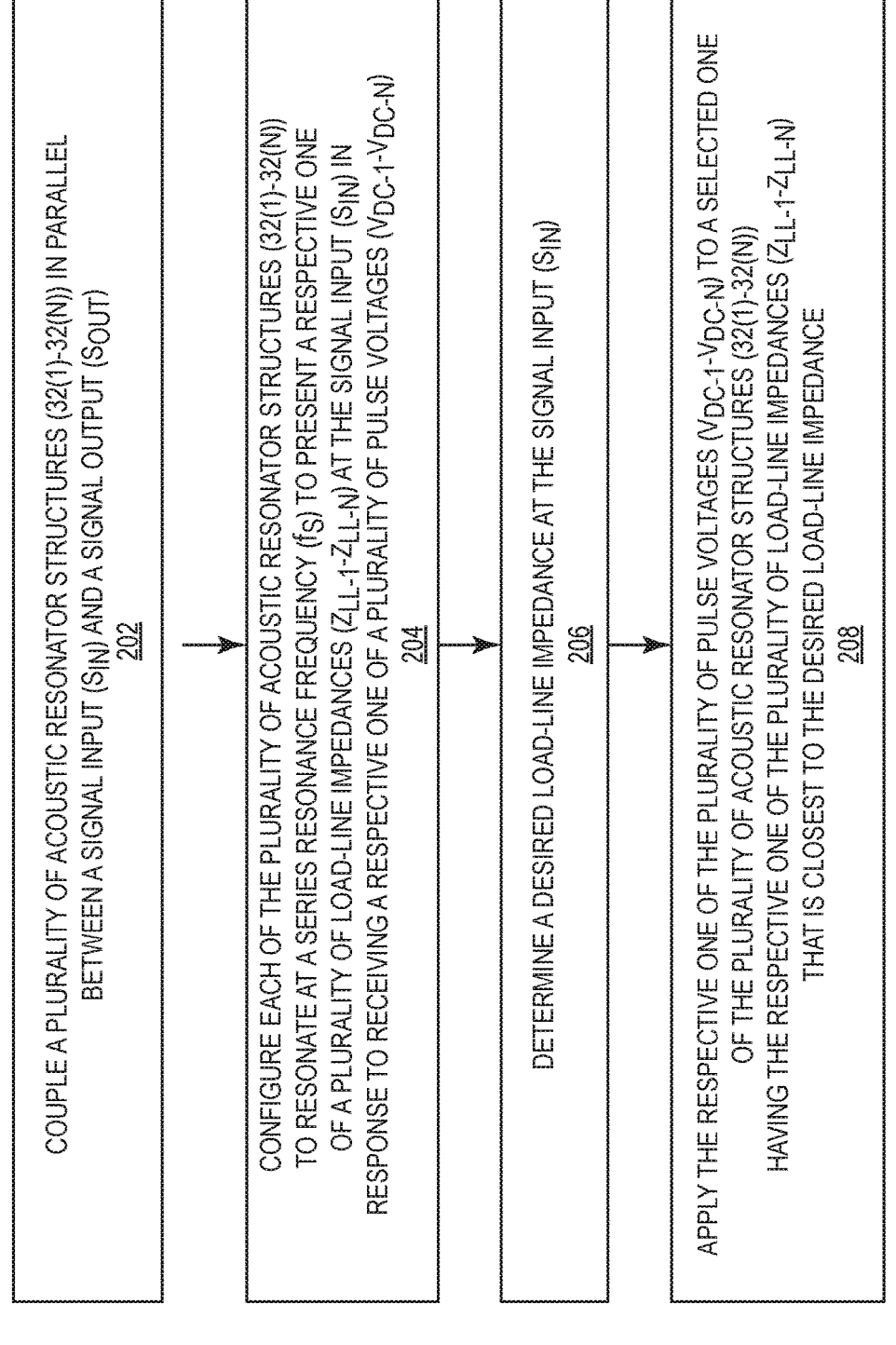

200

COUPLE A PLURALITY OF ACOUSTIC RESONATOR STRUCTURES (32(1)-32(N)) IN PARALLEL BETWEEN A SIGNAL INPUT (S$_{IN}$) AND A SIGNAL OUTPUT (S$_{OUT}$)
202

CONFIGURE EACH OF THE PLURALITY OF ACOUSTIC RESONATOR STRUCTURES (32(1)-32(N)) TO RESONATE AT A SERIES RESONANCE FREQUENCY (f$_S$) TO PRESENT A RESPECTIVE ONE OF A PLURALITY OF LOAD-LINE IMPEDANCES (Z$_{LL-1}$-Z$_{LL-N}$) AT THE SIGNAL INPUT (S$_{IN}$) IN RESPONSE TO RECEIVING A RESPECTIVE ONE OF A PLURALITY OF PULSE VOLTAGES (V$_{DC-1}$-V$_{DC-N}$)
204

DETERMINE A DESIRED LOAD-LINE IMPEDANCE AT THE SIGNAL INPUT (S$_{IN}$)
206

APPLY THE RESPECTIVE ONE OF THE PLURALITY OF PULSE VOLTAGES (V$_{DC-1}$-V$_{DC-N}$) TO A SELECTED ONE OF THE PLURALITY OF ACOUSTIC RESONATOR STRUCTURES (32(1)-32(N)) HAVING THE RESPECTIVE ONE OF THE PLURALITY OF LOAD-LINE IMPEDANCES (Z$_{LL-1}$-Z$_{LL-N}$) THAT IS CLOSEST TO THE DESIRED LOAD-LINE IMPEDANCE
208

*FIG. 8*

ACOUSTIC LOAD-LINE TUNING IN A WIRELESS TRANSMISSION CIRCUIT

RELATED APPLICATIONS

This application claims the benefit of U.S. provisional patent application Ser. No. 63/482,646, filed on Feb. 1, 2023, the disclosure of which is hereby incorporated herein by reference in its entirety.

FIELD OF THE DISCLOSURE

The technology of the disclosure relates generally to load-line impedance matching in a wireless transmission circuit.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on higher data rates offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to a higher power before transmission.

In a typical transmission circuit, a transceiver circuit is configured to generate an RF signal, a power management circuit is configured to generate a modulated voltage, a power amplifier circuit is configured to amplify the RF signal based on the modulated voltage, and an antenna circuit is configured to radiate the RF signal in one or more transmission frequencies. The power amplifier circuit can be further coupled to the antenna circuit via an RF front-end circuit (e.g., filter, switches, etc.). The RF front-end circuit and the antenna circuit may collectively present a load-line impedance to the power amplifier circuit. If the load-line impedance does not match an inherent impedance of the power amplifier circuit, an output reflection coefficient (e.g., S22) of the power amplifier circuit can interact with an input reflection coefficient (e.g., S11) of the RF front-end circuit to cause unwanted distortion (e.g., amplitude-amplitude distortion and/or amplitude-phase distortion) in the RF signal. As such, it is desirable to ensure that the load-line impedance matches the inherent impedance of the power amplifier circuit, particularly when the RF signal is modulated across a wide modulation bandwidth (e.g., ≥200 MHZ).

SUMMARY

Aspects disclosed in the detailed description include acoustic load-line tuning in a wireless transmission circuit (a.k.a. wireless device). In aspects discussed herein, the wireless transmission circuit includes an acoustic load-line tuning circuit that can be configured to adapt a load-line impedance presenting to a power amplifier circuit. In embodiments disclosed herein, the acoustic load-line tuning circuit can be dynamically controlled to provide impedance matching between a power amplifier circuit and other load-line circuits (e.g., filter circuits, antenna switch circuits, and/or antenna circuits). As a result, it is possible to reduce signal reflection resulting from impedance mismatch between the power amplifier circuit and the load-line circuits, thus helping to improve performance of the wireless transmission circuit.

In one aspect, an acoustic load-line tuning circuit is provided. The acoustic load-line tuning circuit includes multiple acoustic resonator structures coupled in parallel between a signal input and a signal output, each of the multiple acoustic resonator structures is configured to resonate at a series resonance frequency to present a respective one of multiple load-line impedances at the signal input in response to receiving a respective one of multiple pulse voltages. The acoustic load-line tuning circuit also includes a control circuit. The control circuit is configured to determine a desired load-line impedance at the signal input. The control circuit is also configured to apply the respective one of the multiple pulse voltages to a selected one of the multiple acoustic resonator structures having the respective one of the multiple load-line impedances that is closest to the desired load-line impedance.

In another aspect, a wireless transmission circuit is provided. The wireless transmission circuit includes an acoustic load-line tuning circuit. The acoustic load-line tuning circuit includes multiple acoustic resonator structures coupled in parallel between a signal input and a signal output, each of the multiple acoustic resonator structures is configured to resonate at a series resonance frequency to present a respective one of multiple load-line impedances at the signal input in response to receiving a respective one of multiple pulse voltages. The acoustic load-line tuning circuit also includes a control circuit. The control circuit is configured to determine a desired load-line impedance at the signal input. The control circuit is also configured to apply the respective one of the multiple pulse voltages to a selected one of the multiple acoustic resonator structures having the respective one of the multiple load-line impedances that is closest to the desired load-line impedance.

In another aspect, a method for performing acoustic impedance tuning in a wireless transmission circuit is provided. The method includes coupling multiple acoustic resonator structures in parallel between a signal input and a signal output. The method also includes configuring each of the multiple acoustic resonator structures to resonate at a series resonance frequency to present a respective one of multiple load-line impedances at the signal input in response to receiving a respective one of multiple pulse voltages. The method also includes determining a desired load-line impedance at the signal input. The method also includes applying the respective one of the multiple pulse voltages to a selected one of the multiple acoustic resonator structures having the respective one of the multiple load-line impedances that is closest to the desired load-line impedance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 8 is a flowchart of an exemplary process for performing acoustic impedance tuning in the wireless transmission circuits of FIGS. 5 and 6.

DETAILED DESCRIPTION

Figure 1:
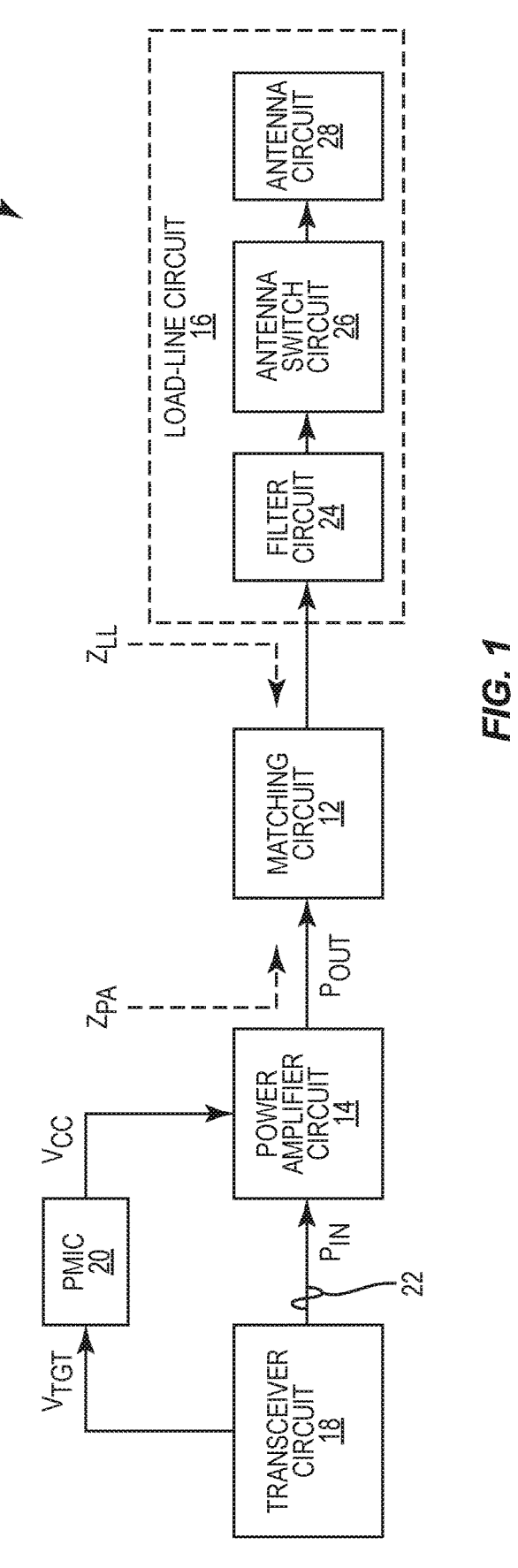
FIG. 1 is a schematic diagram of an exemplary existing wireless transmission circuit wherein a conventional matching circuit can introduce a higher insertion loss when the conventional matching circuit is configured to adapt a load-line impedance between a power amplifier circuit and a load-line circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include acoustic load-line tuning in a wireless transmission circuit (a.k.a. wireless device). In aspects discussed herein, the wireless transmission circuit includes an acoustic load-line tuning circuit that can be configured to adapt a load-line impedance presenting to a power amplifier circuit. In embodiments disclosed herein, the acoustic load-line tuning circuit can be dynamically controlled to provide impedance matching between a power amplifier circuit and other load-line circuits (e.g., filter circuits, antenna switch circuits, and/or antenna circuits). As a result, it is possible to reduce a signal reflection resulting from an impedance mismatch between the power amplifier circuit and the load-line circuits, thus helping to improve performance of the wireless transmission circuit.

Figure 2:
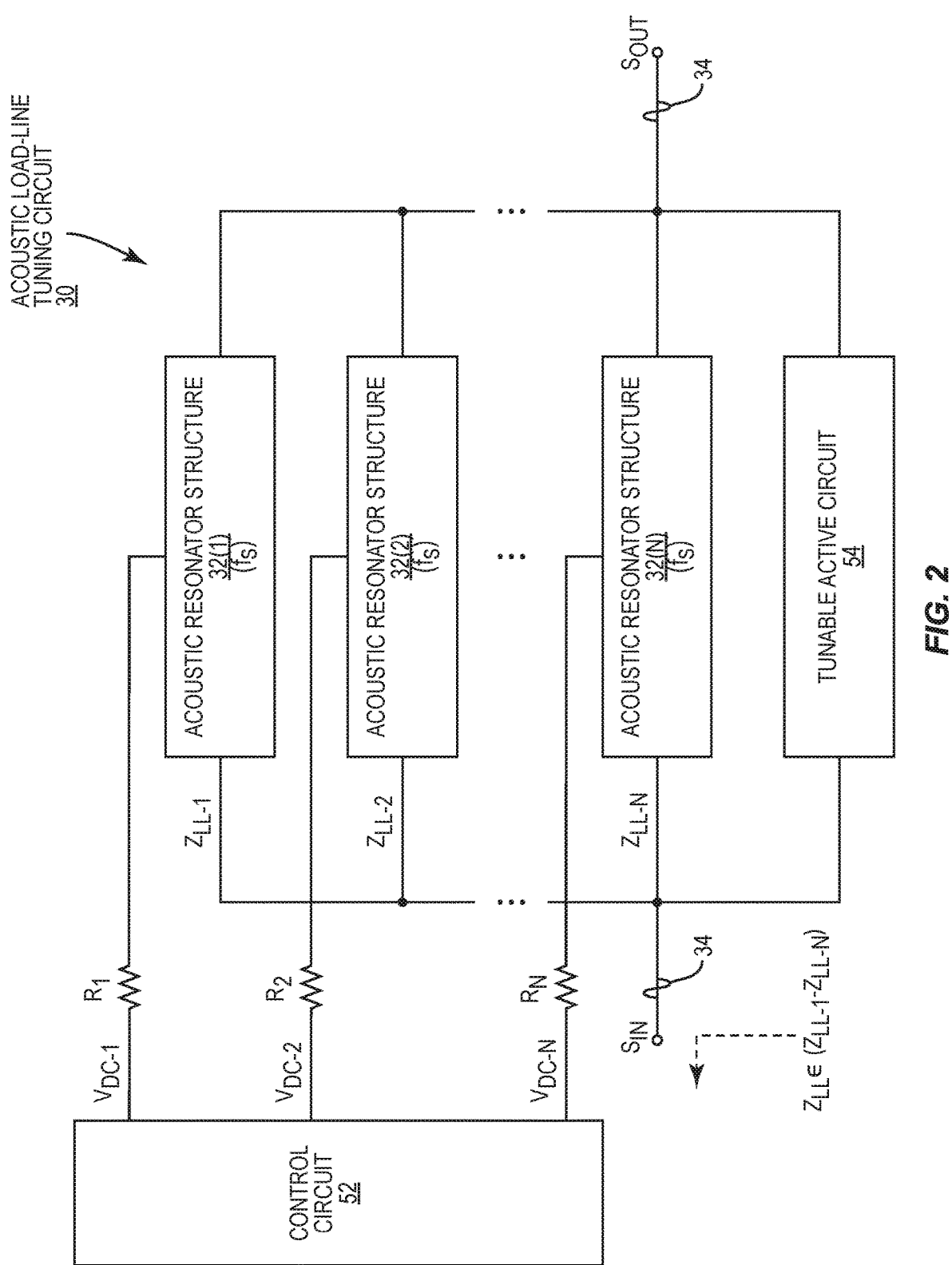
FIG. 2 is a schematic diagram of an exemplary acoustic load-line tuning circuit wherein multiple acoustic resonator structures can be configured to adapt the load-line impedance in FIG. 1 with a lower insertion loss compared to the conventional matching circuit in FIG. 1.

Before discussing an acoustic load-line tuning circuit and a wireless transmission circuit of the present disclosure, starting at FIG. 2, a brief discussion of an existing wireless transmission circuit is first provided with reference to FIG. 1 to help understand some key challenges associated with load-line impedance matching.

FIG. 1 is a schematic diagram of an exemplary existing wireless transmission circuit 10 wherein a conventional matching circuit 12 can introduce a higher insertion loss when the conventional matching circuit 12 is configured to adapt a load-line impedance $Z_{LL}$ between a power amplifier circuit 14 and a load-line circuit 16. The existing wireless transmission circuit 10 also includes a transceiver circuit 18 and a power management integrated circuit (PMIC) 20. The transceiver circuit 18 is configured to generate a signal 22 and provides the signal 22 to the power amplifier circuit 14. The PMIC 20 is configured to generate a voltage $V_{CC}$ and provide the voltage $V_{CC}$ to the power amplifier circuit 14 for amplifying the signal 22 from an input power $P_{IN}$ to an output power $P_{OUT}$. Herein, the PMIC 20 is further configured to generate the voltage $V_{CC}$ based on a target voltage $V_{TGT}$ and the transceiver circuit 18 is further configured to generate and provide the target voltage $V_{TGT}$ to the PMIC 20.

The load-line circuit 16 is generally a radio frequency (RF) frontend module (FEM), which can include a filter circuit 24, an antenna switch circuit 26, and an antenna circuit 28, as an example. On one hand, the load-line circuit 16 inherently presents the load-line impedance $Z_{LL}$ to the power amplifier circuit 14. On the other hand, the power amplifier circuit 14 also inherently presents a power amplifier impedance $Z_{PA}$ to the load-line circuit 16.

To help prevent signal reflection between the power amplifier circuit 14 and the load-line circuit 16, the conventional matching circuit 12 is inserted herein to match the power amplifier impedance $Z_{PA}$ with the load-line impedance $Z_{LL}$. The conventional matching circuit 12 typically includes multiple switchable capacitor-inductor (LC) circuits to modify the load-line impedance $Z_{LL}$ based on different targets of the output power $P_{OUT}$. As such, the conventional matching circuit 12 needs to include multiple switches, such as silicon-on-insulator (SOI) switches and/or microelectromechanical systems (MEMS) switches, to select different LC circuits based on different targets of the output power $P_{OUT}$. Since the switches can introduce significant insertion loss, it is thus desirable to modify the load-line impedance $Z_{LL}$ without employing the switches.

In this regard, FIG. 2 is a schematic diagram of an exemplary acoustic load-line tuning circuit 30 wherein multiple acoustic resonator structures 32(1)-32(N) can be configured to adapt the load-line impedance $Z_{LL}$ in FIG. 1 with a lower insertion loss compared to the conventional matching circuit 12 in FIG. 1. Herein, the acoustic resonator structures 32(1)-32(N) are coupled in parallel between a signal input $S_{IN}$ and a signal output $S_{OUT}$. Each of the acoustic resonator structures 32(1)-32(N) is configured to resonate at a series resonance frequency $f_s$ to pass a signal 34 from the signal input $S_{IN}$ to the signal output $S_{OUT}$. As further discussed in FIGS. 3A-3B below, when resonating at the series resonance frequency $f_s$, each of the acoustic resonator structures 32(1)-32(N) can present a respective one of multiple load-line impedances $Z_{LL-1}$-$Z_{LL-N}$ at the signal input $S_{IN}$ in response to receiving a respective one of multiple pulse voltages $V_{DC-1}$-$V_{DC-N}$. As such, it is possible to eliminate the switches as in the conventional matching circuit 12 to thereby reduce insertion loss.

Figure 3B:
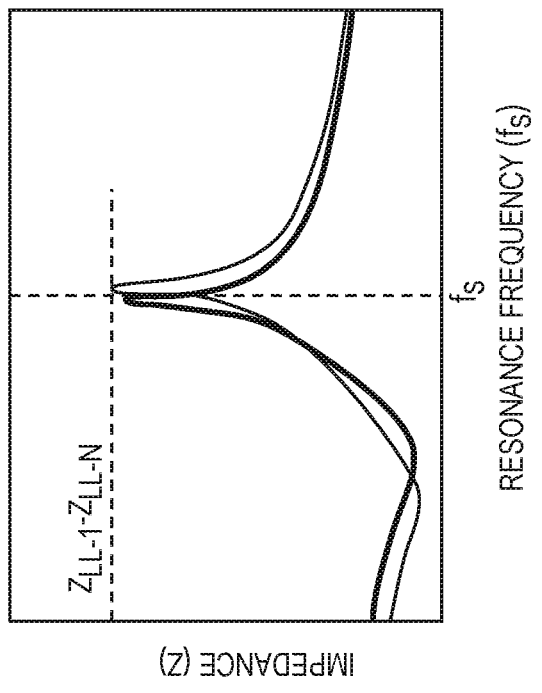
FIG. 3B is a graphic diagram providing an exemplary illustration as to how the acoustic resonator structures in FIG. 2 can be configured to adapt the load-line impedance.
Figure 3A:
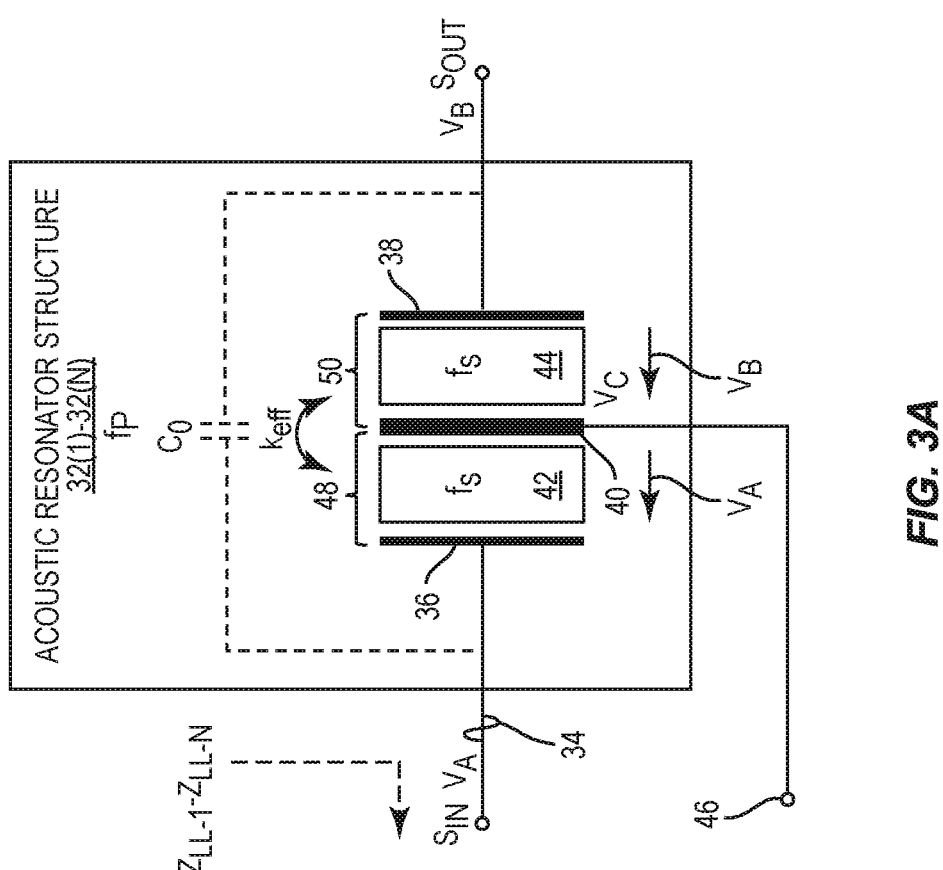
FIG. 3A is a schematic diagram providing an exemplary illustration of any one of the acoustic resonator structures in FIG. 2.

FIG. 3A is a schematic diagram providing an exemplary illustration of any one of the acoustic resonator structures 32(1)-32(N) in FIG. 2. Common elements between FIGS. 2 and 3A are shown therein with common element numbers and will not be re-described herein.

In a non-limiting example, each of the acoustic resonator structures 32(1)-32(N) can be a bulk acoustic wave (BAW) resonator that includes a first electrode 36, a second electrode 38, and a third electrode 40. The third electrode 40 is provided in between the first electrode 36 and the second electrode 38. Each of the acoustic resonator structures 32(1)-32(N) also includes a first piezo layer 42 provided between the first electrode 36 and the third electrode 40 and a second piezo layer 44 provided between the third electrode 40 and the second electrode 38.

In a non-limiting example, the first piezo layer 42 and the second piezo layer 44 can be formed by quartz crystal. The thickness of the first piezo layer 42 and the second piezo layer 44 and/or the mass of the first electrode 36, the second electrode 38, and the third electrode 40 are factors that determine the series resonance frequency $f_s$.

The first electrode 36, the second electrode 38, and the third electrode 40 may be coupled to the signal input $S_{IN}$, the signal output $S_{OUT}$, and a common node 46, respectively. When a first voltage $V_A$ is applied between the signal input $S_{IN}$ and the common node 46 concurrent to a second voltage $V_B$ being applied between the signal output $S_{OUT}$ and the common node 46, each of the acoustic resonator structures 32(1)-32(N) will resonate at the series resonance frequency $f_s$ to pass the signal 34 from the signal input $S_{IN}$ to the signal output $S_{OUT}$. In contrast, each of the acoustic resonator structures 32(1)-32(N) can cause a series capacitance ($C_0$) between the signal input $S_{IN}$ and the signal output $S_{OUT}$ to block the signal 34 in a parallel resonance frequency $f_P$ that is different from the series resonance frequency $f_s$.

The first electrode 36, the first piezo layer 42, and the third electrode 40 may be seen as collectively forming a first resonator 48. Likewise, the third electrode 40, the second piezo layer 44, and the second electrode 38 may be seen as collectively forming a second resonator 50. In this regard, each of the acoustic resonator structures 32(1)-32(N) may be seen as being formed by stacking the first resonator 48 with the second resonator 50. Accordingly, the first resonator 48 and the second resonator 50 can be seen as being mutually coupled based on an effective coupling factor ($k_{eff}$), which can be determined based on equation (Eq. 1) below.

$$k_{eff}^2 = \frac{\pi f_S}{2 f_P} * \left[ \tan^{-1} \frac{\pi f_S}{2 f_P} \right] \qquad \text{(Eq. 1)}$$

Both the first resonator 48 and the second resonator 50 are configured to resonate in the series resonance frequency $f_s$ to pass the signal 34 from the signal input $S_{IN}$ to the signal output $S_{OUT}$. In one non-limiting example, the first electrode 36, the first piezo layer 42, and the third electrode 40 can form a polarized BAW resonator (also referred to as a c-type structure). In this regard, the first piezo layer 42 expands in response to the first voltage $V_A$ being a positive voltage and compresses in response to the first voltage $V_A$ being a negative voltage. The third electrode 40, the second piezo layer 44, and the second electrode 38 can form a polarized-inverted BAW resonator (also referred to as an f-type structure). In this regard, the second piezo layer 44 expands in response to the second voltage $V_B$ being a negative voltage and compresses in response to the second voltage $V_B$ being a positive voltage. Accordingly, each of the acoustic resonator structures 32(1)-32(N) outputs a third voltage $V_C$ (also referred to as a shunt voltage $V_C$) via the common node 46. The third voltage $V_C$ is related to the first voltage $V_A$ and the second voltage $V_B$ according to equation (Eq. 2) below.

$$(V_A - V_C) = (V_C - V_B) \rightarrow V_C = (V_A + V_B)/2 \qquad \text{(Eq. 2)}$$

FIG. 3B is a graphic diagram providing an exemplary illustration as to how each of the acoustic resonator structures $32(1)$-$32(N)$ in FIG. 2 can be configured to adapt a respective one of the load-line impedances $Z_{LL-1}$-$Z_{LL-N}$. As shown herein, each of the acoustic resonator structures $32(1)$-$32(N)$ will resonate at the series resonance frequency $f_s$ to present the respective one of the load-line impedances $Z_{LL-1}$-$Z_{LL-N}$ in response to receiving a respective one of the first voltage $V_A$ and the second voltage $V_B$.

With reference back to FIG. 2, the acoustic load-line tuning circuit 30 includes a control circuit 52, which can be a field-programmable gate array (FPGA) or a microprocessor, as an example. The control circuit 52 is coupled to each of the acoustic resonator structures $32(1)$-$32(N)$ via a respective one of multiple resistors $R_1$-$R_N$. Herein, the control circuit 52 is configured to determine a desired load-line impedance at the signal input $S_{IN}$ and apply the respective one of the pulse voltages $V_{DC-1}$-$V_{DC-N}$ to a selected one of the acoustic resonator structures $32(1)$-$32(N)$. Herein, the control circuit 52 may determine the desired load-line impedance based on a maximum of the signal output power $S_{OUT}$ of the signal 34. In an embodiment, the control circuit 52 determines the selected one of the acoustic resonator structures $32(1)$-$32(N)$ that can present the respective one of the load-line impedances $Z_{LL-1}$-$Z_{LL-N}$ that is closest to the desired load-line impedance.

As shown in FIG. 3A, the first electrode 36 and the second electrode 38 in each of the acoustic resonator structures $32(1)$-$32(N)$ may create an electrical capacitance $C_0$ outside the series resonance frequency $f_s$. Notably, the electrical capacitance $C_0$ can cause each of the acoustic resonator structures $32(1)$-$32(N)$ to resonate at a secondary resonance frequency $f_P$ that is different from the series resonance frequency $f_s$. Consequently, each of the acoustic resonator structures $32(1)$-$32(N)$ may not be able to effectively reject the signal 34 outside the series resonance frequency $f_s$. As such, it may be desired to eliminate the electrical capacitance $C_0$ in each of the acoustic resonator structures $32(1)$-$32(M)$.

In this regard, the acoustic load-line tuning circuit 30 further includes a tunable active circuit 54, which is coupled between the signal input $S_{IN}$ and the signal output $S_{OUT}$ and in parallel to each of the acoustic resonator structures $32(1)$-$32(N)$. As discussed in detail below, the tunable active circuit 54 can be configured to actively cancel the electrical capacitance $C_0$ between the signal input $S_{IN}$ and the signal output $S_{OUT}$, thus helping to improve performance of the acoustic load-line tuning circuit 30.

Figure 4:
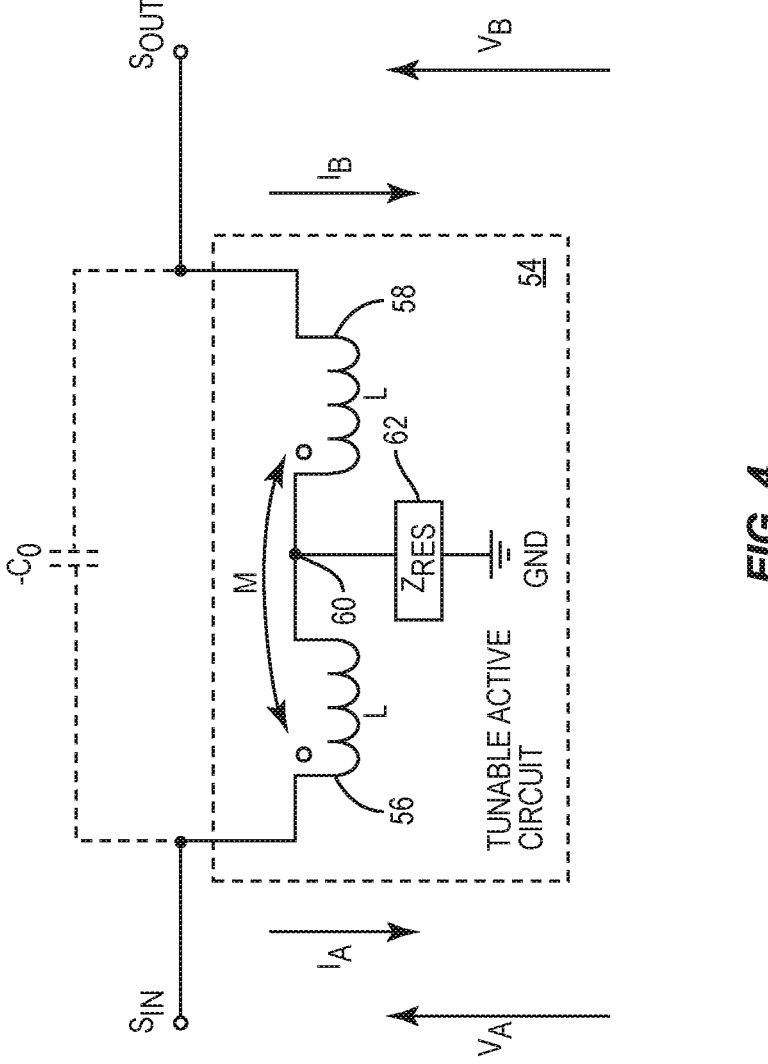
FIG. 4 is a schematic diagram of an exemplary tunable active circuit in the acoustic load-line tuning circuit of FIG. 2.

FIG. 4 is a schematic diagram providing an exemplary illustration of the tunable active circuit 54 in FIG. 2. Common elements between FIGS. 2 and 4 are shown therein with common element numbers and will not be re-described herein.

In a non-limiting example, the tunable active circuit 54 includes a first inductor 56 and a second inductor 58 that are coupled in series between the signal input $S_{IN}$ and the signal output $S_{OUT}$. In this regard, the first inductor 56 and the second inductor 58 are coupled in parallel to each of the acoustic resonator structures $32(1)$-$32(N)$ in FIG. 2. More specifically, the first inductor 56 is coupled between the signal input $S_{IN}$ and an intermediate node 60 and the second inductor 58 is coupled between the intermediate node 60 and the signal output $S_{OUT}$.

Each of the first inductor 56 and the second inductor 58 is configured to have a self-inductance L. In a non-limiting example, the first inductor 56 can induce a first time-variant current $I_A$ when a first time-variant voltage $V_A$ is applied to the first inductor 56. The first time-variant current $I_A$ can induce a time-variant magnetic field (not shown) that is coupled to the second inductor 58. The amount of the magnetic field being coupled from the first inductor 56 to the second inductor 58 can be described based on a coupling factor k ($0 \leq k \leq 1$). When the coupling factor k equals zero (0), it means that none of the magnetic field is coupled from the first inductor 56 to the second inductor 58. In contrast, when the coupling factor k equals one (1), it means that all of the magnetic field is coupled from the first inductor 56 to the second inductor 58.

When the coupling factor k is greater than 0 (k>0), some or all of the magnetic field is coupled from the first inductor 56 to the second inductor 58. The time-variant magnetic field can cause a second time-variant voltage $V_B$, which can further induce a second time-variant current $I_B$, in the second inductor 58. Collectively, the first inductor 56 and the second inductor 58 present a mutual-inductance M between the signal input $S_{IN}$ and the signal output $S_{OUT}$. Herein, the first inductor 56 and the second inductor 58 are negatively coupled. Accordingly, the mutual-inductance M of the first inductor 56 and the second inductor 58 can be expressed in equation (Eq. 3) below.

$$M = -k * L \qquad \text{(Eq. 3)}$$

The tunable active circuit 54 also includes an impedance circuit 62. In a non-limiting example, the impedance circuit 62 is coupled between the intermediate node 60 and a ground (GND). The impedance circuit 62 can be configured to present a shunt impedance $Z_{RES}$ between the intermediate node 60 and the GND. By configuring the impedance circuit 62 to actively generate the shunt impedance $Z_{RES}$, it is possible to cause a negative capacitance $-C_0$ being created between the signal input $S_{IN}$ and the signal output $S_{OUT}$ to thereby cancel the electrical capacitance $C_0$.

Figure 5:
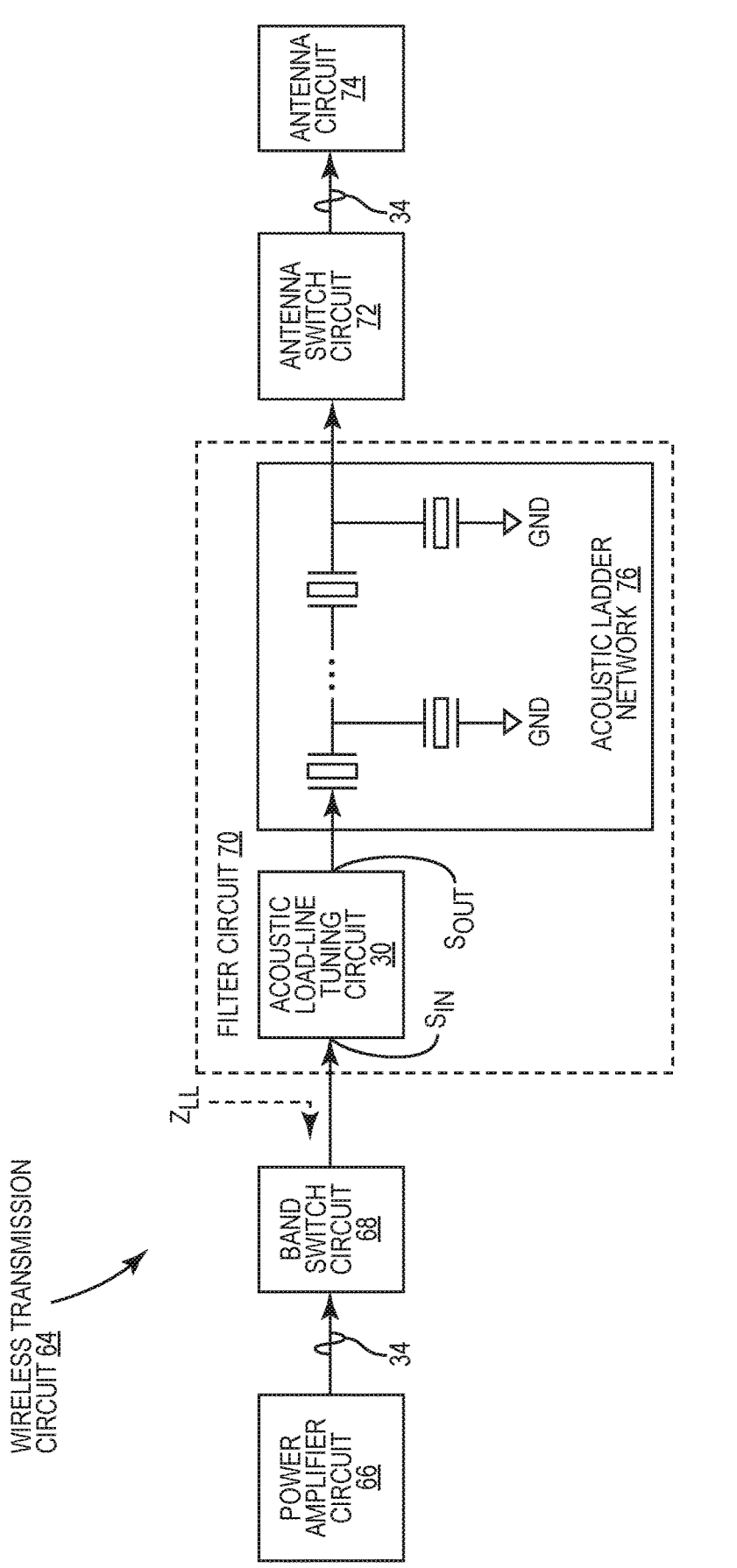
FIG. 5 is a schematic diagram of an exemplary wireless transmission circuit incorporating the acoustic load-line tuning circuit of FIG. 2 in accordance with one embodiment of the present disclosure.

The acoustic load-line tuning circuit 30 can be provided in a wireless transmission circuit (a.k.a. wireless device) according to various embodiments of the present disclosure. FIG. 5 is a schematic diagram of an exemplary wireless transmission circuit 64 incorporating the acoustic load-line tuning circuit 30 of FIG. 2 in accordance with one embodiment of the present disclosure. Common elements between FIGS. 2 and 5 are shown therein with common element numbers and will not be re-described herein.

The wireless transmission circuit 64 includes a power amplifier circuit 66, a band switch circuit 68, a filter circuit 70, an antenna switch circuit 72, and an antenna circuit 74. Herein, the power amplifier circuit 66 is configured to amplify the signal 34. The band switch circuit 68 is coupled to the power amplifier circuit 66 and configured to pass the amplified signal 34 in a respective one of multiple passbands.

In this embodiment, the filter circuit 70 includes the acoustic load-line tuning circuit 30 and an acoustic ladder network 76. The acoustic load-line tuning circuit 30 is configured to present a selected one of the load-line impedances $Z_{LL-1}$-$Z_{LL-N}$ at the signal input $S_{IN}$ as the load-line impedance $Z_{LL}$. Although the acoustic load-line tuning circuit 30 is shown herein to be part of the filter circuit 70, it should be appreciated that it is also possible to provide the acoustic load-line tuning circuit 30 as a separate circuit from the filter circuit 70.

The antenna switch circuit 72 is coupled to the filter circuit 70 to route the signal 34 to appropriate antennas (not shown) in the antenna circuit 74.

Figure 6:
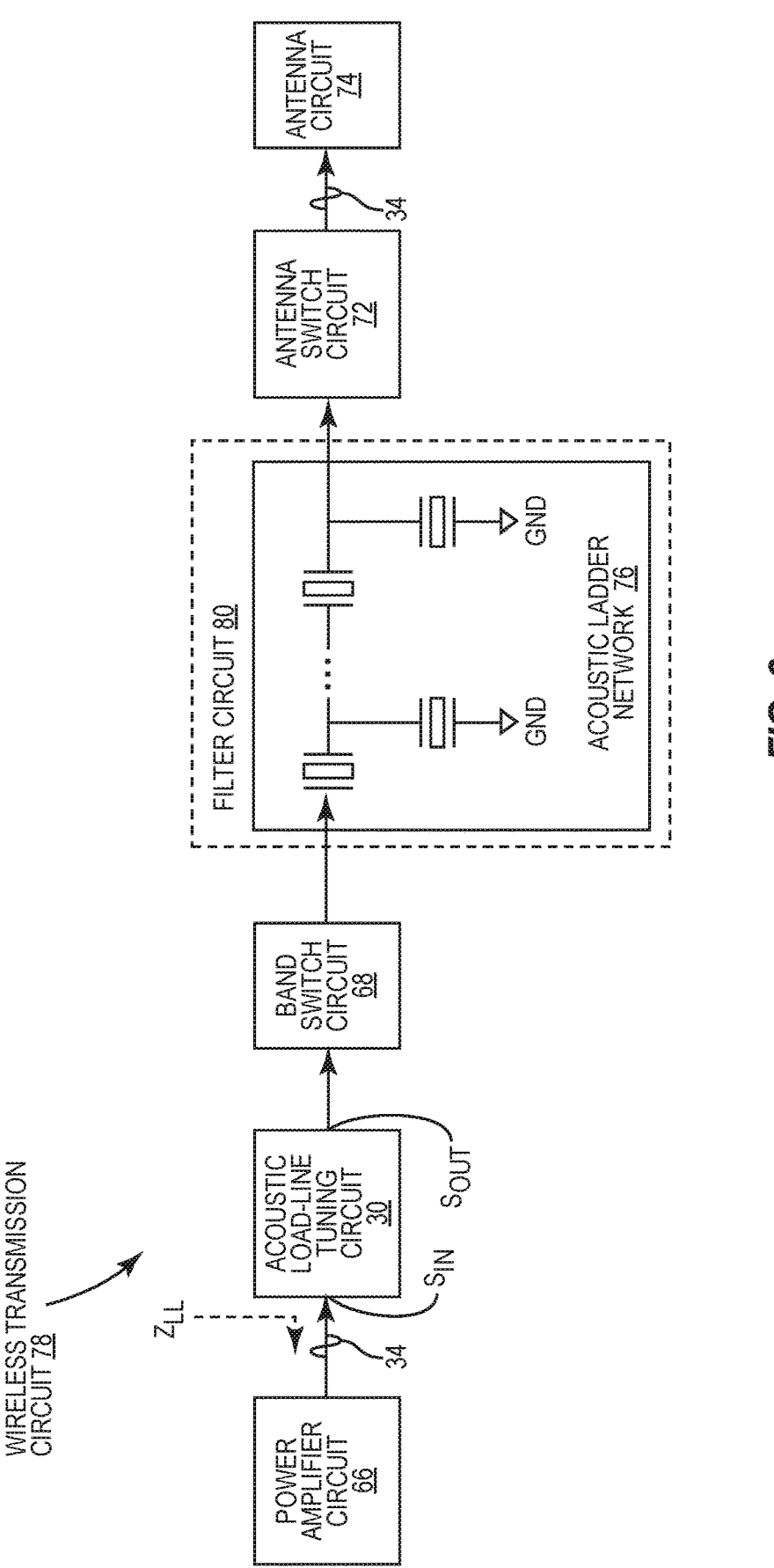
FIG. 6 is a schematic diagram of an exemplary wireless transmission circuit incorporating the acoustic load-line tuning circuit of FIG. 2 in accordance with another embodiment of the present disclosure.

FIG. 6 is a schematic diagram of an exemplary wireless transmission circuit 78 incorporating the acoustic load-line tuning circuit 30 of FIG. 2 in accordance with another embodiment of the present disclosure. Common elements between FIGS. 2, 5, and 6 are shown therein with common element numbers and will not be re-described herein.

Herein, the wireless transmission circuit 78 includes a filter circuit 80, which includes only the acoustic ladder network 76. The acoustic load-line tuning circuit 30 is instead coupled in between the power amplifier circuit 66 and the band switch circuit 68.

Figure 7:
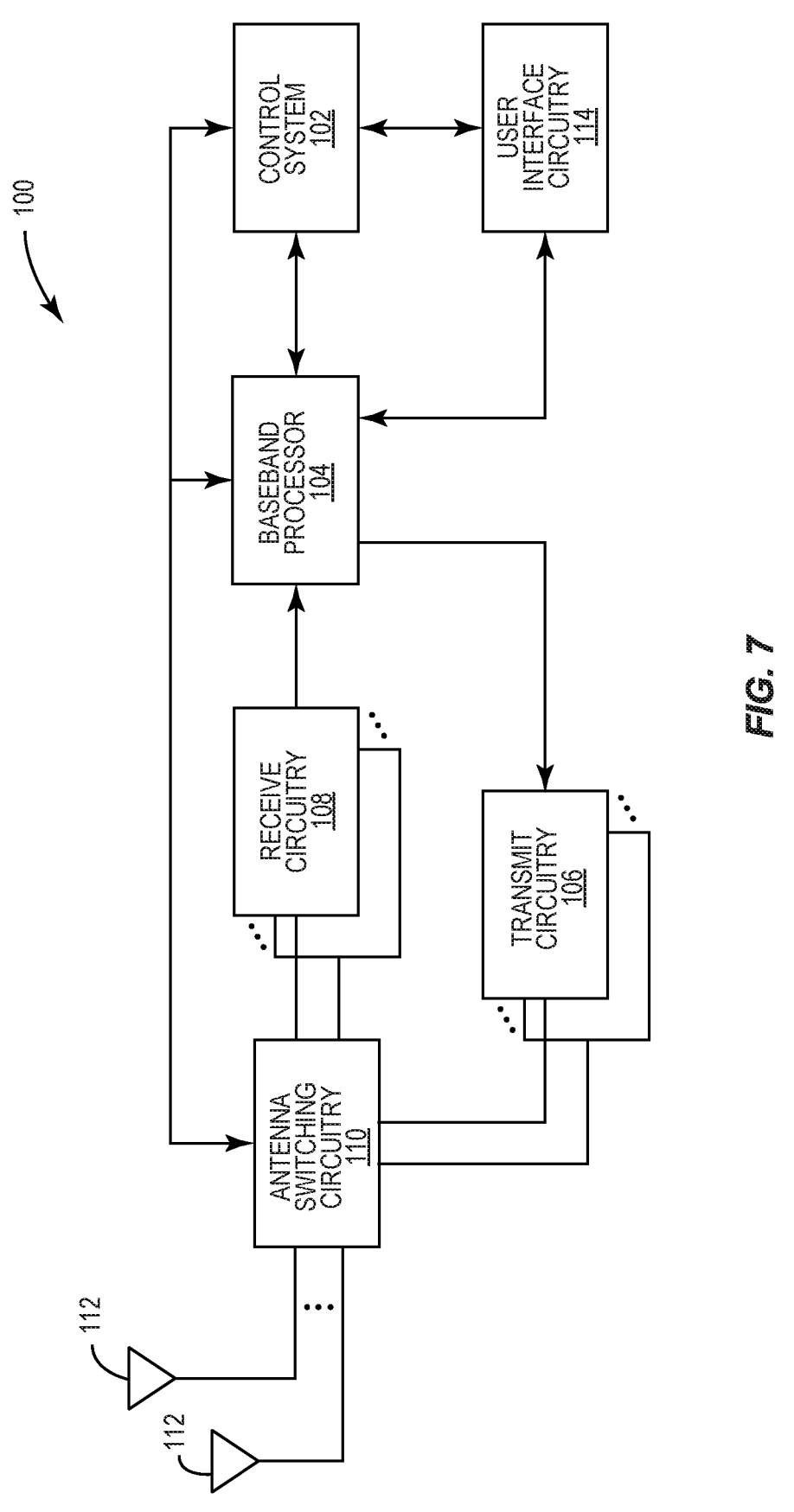
FIG. 7 is a schematic diagram of an exemplary user element wherein the wireless transmission circuits of FIGS. 5 and 6 can be provided.

The wireless transmission circuit 64 of FIG. 5 and the wireless transmission circuit 78 of FIG. 6 can be provided in a user element to enable acoustic load-line tuning according to embodiments described above. In this regard, FIG. 7 is a schematic diagram of an exemplary user element 100 wherein the wireless transmission circuit 64 of FIG. 5 and the wireless transmission circuit 78 of FIG. 6 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

The wireless transmission circuit 64 of FIG. 5 and the wireless transmission circuit 78 of FIG. 6 can be configured to perform acoustic impedance tuning based on a process. In this regard, FIG. 8 is a flowchart of an exemplary process 200 for performing acoustic impedance tuning in the wireless transmission circuit 64 of FIG. 5 and the wireless transmission circuit 78 of FIG. 6.

Herein, the process 200 includes coupling the acoustic resonator structures 32(1)-32(N) in parallel between the signal input $S_{IN}$ and the signal output $S_{OUT}$ (step 202). The process 200 also includes configuring each of the acoustic resonator structures 32(1)-32(N) to resonate at the series resonance frequency $f_s$ to present a respective one of the load-line impedances $Z_{LL-1}$-$Z_{LL-N}$ at the signal input $S_{IN}$ in response to receiving a respective one of the pulse voltages $V_{DC-1}$-$V_{DC-N}$(step 204). The process 200 also includes determining a desired load-line impedance at the signal input $S_{IN}$ (step 206). The process 200 also includes applying the respective one of the pulse voltages $V_{DC-1}$-$V_{DC-N}$ to a selected one of the acoustic resonator structures 32(1)-32(N) having the respective one of the load-line impedances $Z_{LL-1}$-$Z_{LL-N}$ that is closest to the desired load-line impedance (step 208).

Those skilled in the art will recognize improvements and modifications to the embodiments of the present disclosure. All such improvements and modifications are considered within the scope of the concepts disclosed herein and the claims that follow.

What is claimed is:

1. An acoustic load-line tuning circuit comprising:

a plurality of acoustic resonator structures coupled in parallel between a signal input and a signal output and free of switches, each of the plurality of acoustic resonator structures is configured to resonate at a series resonance frequency to pass a signal from the signal input to the signal output and present a respective one of a plurality of load-line impedances at the signal input in response to receiving a respective one of a plurality of pulse voltages; and a control circuit configured to:

determine a desired load-line impedance at the signal input based on a maximum power of the signal; and apply the respective one of the plurality of pulse voltages to a selected one of the plurality of acoustic resonator structures having the respective one of the plurality of load-line impedances that is closest to the desired load-line impedance.

2. The acoustic load-line tuning circuit of claim 1, wherein the control circuit is coupled to each of the plurality of acoustic resonator structures via a respective one of a plurality of resistors.

3. The acoustic load-line tuning circuit of claim 1, further comprising a tunable active circuit coupled in parallel to the plurality of acoustic resonator structures between the signal input and the signal output, the tunable active circuit is configured to cancel a respective electrical capacitance associated with each of the plurality of acoustic resonator structures.

4. The acoustic load-line tuning circuit of claim 3, wherein the tunable active circuit comprises:

a first inductor and a second inductor coupled in series between the signal input and the signal output; and an impedance circuit coupled between an intermediate node located in between the first inductor and the second inductor and a ground, the impedance circuit is configured to actively generate a shunt impedance to thereby cause a negative capacitance between the signal input and the signal output.

5. The acoustic load-line tuning circuit of claim 1, wherein each of the plurality of acoustic resonator structures comprises a bulk acoustic wave (BAW) resonator.

6. The acoustic load-line tuning circuit of claim 5, wherein the BAW resonator comprises a pair of stacked BAW resonators.

7. The acoustic load-line tuning circuit of claim 6, wherein the pair of stacked BAW resonators comprises a polarized BAW resonator and a polarized-inverted BAW resonator.

8. A wireless transmission circuit comprising:

an acoustic load-line tuning circuit comprising:

a plurality of acoustic resonator structures coupled in parallel between a signal input and a signal output and free of switches, each of the plurality of acoustic resonator structures is configured to resonate at a series resonance frequency to pass a signal from the signal input to the signal output and present a respective one of a plurality of load-line impedances at the signal input in response to receiving a respective one of a plurality of pulse voltages; and a control circuit configured to:

determine a desired load-line impedance at the signal input based on a maximum power of the signal; and apply the respective one of the plurality of pulse voltages to a selected one of the plurality of acoustic resonator structures having the respective one of the plurality of load-line impedances that is closest to the desired load-line impedance.

9. The wireless transmission circuit of claim 8, wherein the control circuit is coupled to each of the plurality of acoustic resonator structures via a respective one of a plurality of resistors.

10. The wireless transmission circuit of claim 8, wherein the acoustic load-line tuning circuit further comprises a tunable active circuit coupled in parallel to the plurality of acoustic resonator structures between the signal input and the signal output, the tunable active circuit is configured to cancel a respective electrical capacitance associated with each of the plurality of acoustic resonator structures.

11. The wireless transmission circuit of claim 10, wherein the tunable active circuit comprises:

a first inductor and a second inductor coupled in series between the signal input and the signal output; and an impedance circuit coupled between an intermediate node located in between the first inductor and the second inductor and a ground, the impedance circuit is configured to actively generate a shunt impedance to thereby cause a negative capacitance between the signal input and the signal output.

12. The wireless transmission circuit of claim 8, wherein each of the plurality of acoustic resonator structures comprises a bulk acoustic wave (BAW) resonator.

13. The wireless transmission circuit of claim 12, wherein the BAW resonator comprises a pair of stacked BAW resonators.

14. The wireless transmission circuit of claim 13, wherein the pair of stacked BAW resonators comprises a polarized BAW resonator and a polarized-inverted BAW resonator.

15. The wireless transmission circuit of claim 8, further comprising:

a power amplifier circuit configured to amplify the signal;

a band switch circuit coupled to the power amplifier circuit and configured to pass the amplified signal in a respective one of a plurality of passbands;

a filter circuit comprising the acoustic load-line tuning circuit and configured to:

pass the signal in the series resonance frequency of the selected one of the plurality of acoustic resonator structures; and present the respective one of the plurality of load-line impedances of the selected one of the plurality of acoustic resonator structures at the signal input;

an antenna switch circuit coupled to the filter circuit; and an antenna circuit coupled to the antenna switch circuit.

16. The wireless transmission circuit of claim 8, further comprising:

a power amplifier circuit configured to amplify the signal;

the acoustic load-line tuning circuit coupled to the power amplifier circuit and configured to:

pass the signal in the series resonance frequency of the selected one of the plurality of acoustic resonator structures; and present the respective one of the plurality of load-line impedances of the selected one of the plurality of acoustic resonator structures at the signal input;

a band switch circuit coupled to the power amplifier circuit and configured to pass the amplified signal in a respective one of a plurality of passbands;

a filter circuit comprising an acoustic ladder network coupled to the band switch circuit;

an antenna switch circuit coupled to the filter circuit; and an antenna circuit coupled to the antenna switch circuit.

17. A method for performing acoustic impedance tuning in a wireless transmission circuit comprising:

coupling a plurality of acoustic resonator structures in parallel between a signal input and a signal output and free of switches;

configuring each of the plurality of acoustic resonator structures to resonate at a series resonance frequency to pass a signal from the signal input to the signal output and present a respective one of a plurality of load-line impedances at the signal input in response to receiving a respective one of a plurality of pulse voltages;

determining a desired load-line impedance at the signal input based on a maximum power of the signal; and applying the respective one of the plurality of pulse voltages to a selected one of the plurality of acoustic resonator structures having the respective one of the plurality of load-line impedances that is closest to the desired load-line impedance.

18. The method of claim 17, further comprising performing the acoustic impedance tuning in the wireless transmission circuit using an acoustic load-line tuning circuit.

* * * * *